(12) United States Patent
Okumura et al.

(10) Patent No.: US 9,741,538 B2
(45) Date of Patent: Aug. 22, 2017

(54) PLASMA PROCESSING APPARATUS, PLASMA PROCESSING METHOD, AND METHOD FOR MANUFACTURING ELECTRONIC DEVICE

(71) Applicant: Panasonic Intellectual Property Management Co., Ltd., Osaka (JP)

(72) Inventors: Tomohiro Okumura, Osaka (JP); Satoshi Suemasu, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/075,044

(22) Filed: Mar. 18, 2016

(65) Prior Publication Data

US 2016/0293455 A1 Oct. 6, 2016

(30) Foreign Application Priority Data

Apr. 2, 2015 (JP) ................. 2015-075779

(51) Int. Cl.
C23C 16/00 (2006.01)
H01L 21/00 (2006.01)
(Continued)

(52) U.S. Cl.
CPC .. *H01J 37/32009* (2013.01); *C23C 16/45595* (2013.01); *C23C 16/513* (2013.01); *H01J 37/321* (2013.01); *H05H 1/30* (2013.01)

(58) Field of Classification Search
CPC ................. H01J 37/321; H01J 37/3211; H01J 37/32119; H01J 37/32128;
(Continued)

(56) References Cited

U.S. PATENT DOCUMENTS

2008/0286980 A1* 11/2008 Ishimaru ............... C23C 16/509
  438/716
2012/0325777 A1* 12/2012 Okumura ................. H05H 1/30
  216/68
(Continued)

FOREIGN PATENT DOCUMENTS

JP   2013-045822 A   3/2013
JP   2013-120633     6/2013
(Continued)

OTHER PUBLICATIONS

T. Okumura and H. Kawaura, "Elongated Inductively Coupled Thermal Plasma Torch Operable at Atmospheric Pressure", Jpn. J. Appl. Phys. 52 (2013) 05EE01.

*Primary Examiner* — Luz Alejandro Mulero
(74) *Attorney, Agent, or Firm* — Panasonic IP Management; Kerry S. Culpepper

(57) ABSTRACT

Linear coils, a first ceramic block, and a second ceramic block are arranged in an inductively-coupled plasma torch. A chamber has an annular shape. Plasma generated inside the chamber is ejected to a substrate through an opening portion in the chamber. The substrate is processed by relatively moving the chamber and the substrate in a direction perpendicular to a longitudinal direction of the opening portion. The coil is arranged inside a rotating cylindrical ceramic pipe. Accordingly, the plasma can be generated with excellent power efficiency, and fast plasma processing can be performed.

6 Claims, 11 Drawing Sheets

(51) Int. Cl.
*H01J 37/32* (2006.01)
*C23C 16/455* (2006.01)
*C23C 16/513* (2006.01)
*H05H 1/30* (2006.01)

(58) Field of Classification Search
CPC .......... H01J 37/32146; H01J 37/32155; H01J 37/32165; H01J 37/32174; H01J 37/32183
USPC ...... 118/723 I, 723 IR, 723 AN; 156/345.48, 156/345.49; 315/111.51
See application file for complete search history.

(56) References Cited

U.S. PATENT DOCUMENTS

| | | |
|---|---|---|
| 2013/0115780 A1 | 5/2013 | Okumura et al. |
| 2013/0230990 A1 | 9/2013 | Okumura et al. |
| 2014/0220784 A1 | 8/2014 | Okumura et al. |
| 2014/0291290 A1 | 10/2014 | Kitaoka et al. |

FOREIGN PATENT DOCUMENTS

| | | |
|---|---|---|
| JP | 2013-120684 | 6/2013 |
| JP | 2013-120685 | 6/2013 |
| JP | 2013-211244 A | 10/2013 |
| JP | 2014-209433 A | 11/2014 |

\* cited by examiner

PLASMA PROCESSING APPARATUS, PLASMA PROCESSING METHOD, AND METHOD FOR MANUFACTURING ELECTRONIC DEVICE

TECHNICAL FIELD

The technical field relates to a plasma processing apparatus, a plasma processing method, and a method for manufacturing an electronic device, in which thermal plasma processing for a substrate is performed by emitting thermal plasma to the substrate, or in which low-temperature plasma processing for the substrate is performed by emitting plasma using reactive gas or by concurrently emitting the plasma with a reactive gas flow.

BACKGROUND

In the related art, a semiconductor thin film such as polycrystalline silicon (poly-Si) is widely used for a thin film transistor (TFT) or a solar cell. As a method for inexpensively forming the semiconductor thin film, the semiconductor thin film is crystallized by emitting laser beams to an amorphous silicon film. A laser process can also be applied to activation of impure atoms introduced into a semiconductor substrate by means of ion implantation or plasma doping. However, this laser annealing technique has a disadvantage in that an attainable temperature greatly varies or a seam appears depending on whether a heating object absorbs light a lot or a little, and additionally requires very expensive equipment.

Therefore, a technique has been studied in which heating can be performed by generating elongated thermal plasma and by performing scanning in only one direction without depending on light absorption by the heating object, and in which thermal processing is inexpensively and seamlessly performed (for example, refer to Japanese Patent Unexamined Publication Nos. 2013-120633, 2013-120684, and 2013-120685, and T Okumura and H. Kawaura, Jpn. J. Appl. Phys. 52 (2013) 05EE01).

SUMMARY

However, a technique for generating elongated thermal plasma disclosed in Japanese Patent Unexamined Publication Nos. 2013-120633, 2013-120684, and 2013-120685 in the related art is employed for use in performing high-temperature processing in the vicinity of a substrate surface within a very short time, such as semiconductor crystallization. According to this technique, since a coil is arranged along an entire chamber, the apparatus cannot be freely designed. If high-frequency power is excessively increased in order to increase plasma emitting intensity, a plasma source is damaged by heat. Thus, it is necessary to suppress the high-frequency power. As a result, there is a problem of reduced processing speed (the number of substrates which can be processed per unit time).

In view of this problem, the present disclosure concerns a plasma processing apparatus, a plasma processing method, and a method for manufacturing an electronic device in which high-temperature thermal processing is uniformly performed in the vicinity of a substrate surface within a very short time, or low-temperature plasma processing for a substrate is performed by emitting plasma using reactive gas or by concurrently emitting the plasma with a reactive gas flow. Accordingly, fast processing can be performed, a configuration allowing free design can be adopted, and the plasma can be stably utilized.

According to a first aspect, a plasma processing apparatus uses an inductively-coupled plasma torch. The plasma processing apparatus includes an annular chamber that includes a linear opening portion, and that communicates with the opening portion surrounded with a dielectric member except for the opening portion, a coil that is disposed in the vicinity of the chamber, a power source that is connected to the coil, and a substrate mounting table. The chamber includes two linear regions having a linear region adjacent to the linear opening portion and a linear region arranged parallel thereto. The coil includes two linear conductors arranged along only the two linear regions.

According to this configuration, it is possible to achieve a plasma processing apparatus which can be freely designed.

In the plasma processing apparatus according to the first aspect, it is preferable that in the dielectric member surrounding the chamber, a portion configuring a surface facing the substrate mounting table includes a cylinder arranged parallel to a linear direction of the opening portion. It is more preferable that the plasma processing apparatus includes a rotary mechanism that rotates the cylinder around an axis of the cylinder.

According to this configuration, even in a case of using higher power, the dielectric member is less likely to be damaged. Therefore, fast processing can be performed, and plasma can be stably utilized.

It is preferable that the cylinder is a pipe internally having a cavity, and includes a mechanism for causing a refrigerant to flow into the cavity formed inside the cylinder.

According to this configuration, even in a case of using high power, the dielectric member is less likely to be damaged.

It is preferable that the cylinder is longer than the length of the opening portion in the linear direction.

According to this configuration, it is possible to effectively suppress damage to the dielectric member.

In the plasma processing apparatus according to the first aspect, the chamber may be arranged along a plane which is substantially perpendicular to a plane formed by the substrate mounting table, or may be arranged along a plane which is substantially parallel to a plane formed by the substrate mounting table.

If is preferable that one of the coils is arranged in the cavity inside the cylinder.

According to this configuration, it is possible to achieve plasma processing which has excellent efficiency in generating plasma.

According to a second aspect, a plasma processing apparatus uses an inductively-coupled plasma torch. The plasma processing apparatus includes an annular chamber that includes a linear opening portion, and that communicates with the opening portion surrounded with a dielectric member except for the opening portion, a coil that is disposed in the vicinity of the chamber, a power source that is connected to the coil, and a substrate mounting table. The following characteristics are further provided.

(1) The chamber includes a linear region adjacent to the linear opening portion. In the dielectric member surrounding the chamber, a portion configuring a surface facing the substrate mounting table includes a cylinder arranged parallel to a linear direction of the opening portion.

(2) There is provided a rotary mechanism that rotates the cylinder around an axis of the cylinder.

(3) A portion of the coil is arranged in the cavity inside the cylinder.

According to this configuration, even, in a case of using high power, the dielectric member is less likely to be damaged. Therefore, fast processing can be performed, and plasma can be stably utilized.

According to a third aspect, a plasma processing method uses an inductively-coupled plasma torch. The plasma processing method includes supplying gas into an annular chamber which is surrounded with a dielectric member, ejecting the gas to a substrate through a linear opening portion which communicates with the chamber, supplying power to a coil, generating a high-frequency electromagnetic field inside the chamber so as to generate plasma, and processing a surface of the substrate. The following characteristics are further provided.

The chamber includes two linear regions having a linear region adjacent to the linear opening portion and a linear region arranged parallel thereto. The coil includes two linear conductors arranged along only the two linear regions.

According to this configuration, it is possible to achieve a plasma processing method which can be freely designed.

According to a fourth aspect, a plasma processing method uses an inductively-coupled plasma torch. The plasma processing method includes supplying gas into an annular chamber which is surrounded with a dielectric member, ejecting the gas to a substrate through a linear opening portion which communicates with the chamber, supplying power to a coil, generating a high-frequency electromagnetic field inside the chamber so as to generate plasma, and processing a surface of the substrate. The following characteristics are further provided.

(1) The chamber includes a linear region adjacent to the linear opening portion. In the dielectric member surrounding the chamber, a portion configuring a surface facing the substrate mounting table includes a cylinder arranged parallel to a linear direction of the opening portion.

(2) There is provided a rotary mechanism that rotates the cylinder around an axis of the cylinder.

(3) A portion of the coil is arranged in the cavity inside the cylinder.

According to this configuration, even in a case of using high power, the dielectric member is less likely to be damaged. Therefore, fast processing can be performed, and plasma can. be stably utilized.

According to a fifth aspect, a method for manufacturing an electronic device uses the plasma processing method according to the third aspect or the fourth aspect.

According to this configuration, it is possible to achieve fast plasma processing which can be freely designed.

Accordingly, when high-temperature thermal processing is uniformly performed in the vicinity of a substrate surface within a very short time, or when low-temperature plasma processing for a substrate is performed by emitting plasma using reactive gas or by concurrently emitting the plasma with a reactive gas flow, fast processing can be performed, a configuration allowing free design can be adopted, and the plasma can be stably utilized.

DESCRIPTION OF EMBODIMENTS

Hereinafter, a plasma processing apparatus according to various embodiments will be described with reference to the drawings.

Embodiment 1

Hereinafter, Embodiment 1 will be described with reference to FIGS. 1A to 4.

Figure 1A:
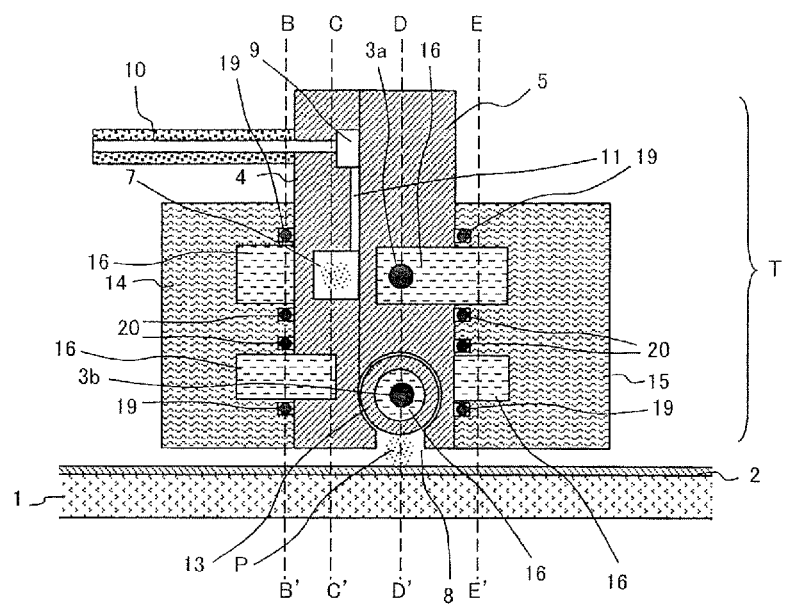
FIGS. 1A to 1E are sectional views illustrating a configuration of a plasma processing apparatus according to Embodiment 1.
Figure 1B:
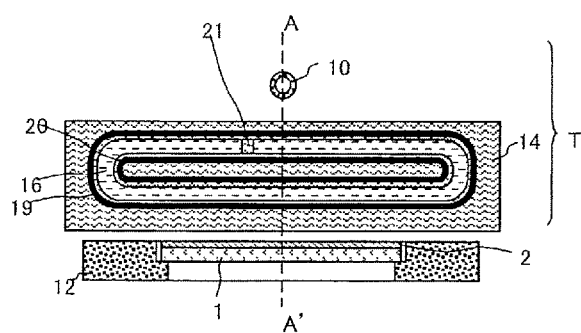
Figure 1C:
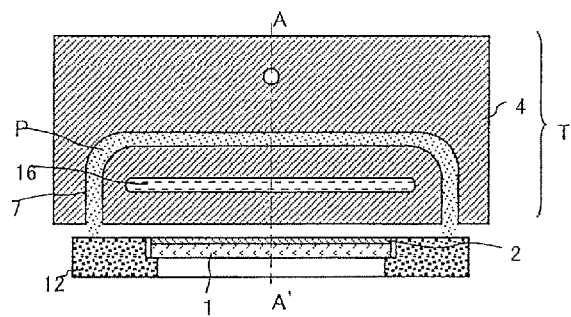
Figure 1D:
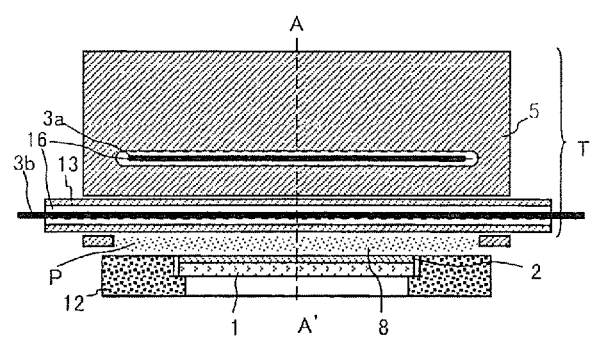
Figure 1E:
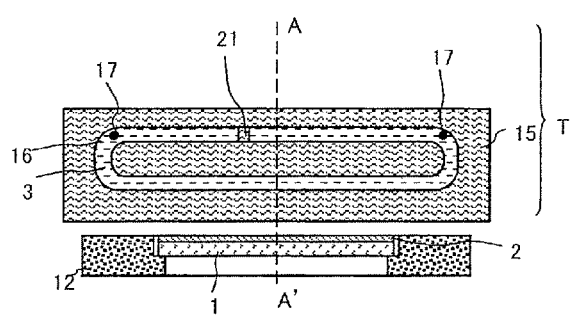
Figure 2:
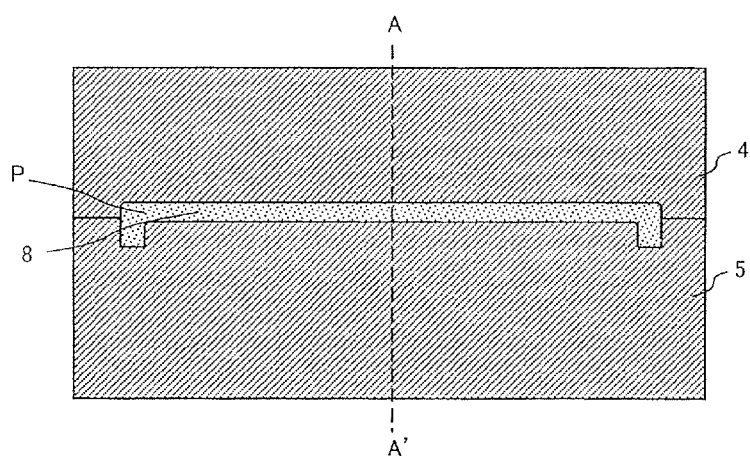
FIG. 2 is a plan view illustrating a configuration of the plasma processing apparatus according to Embodiment 1.
Figure 3:
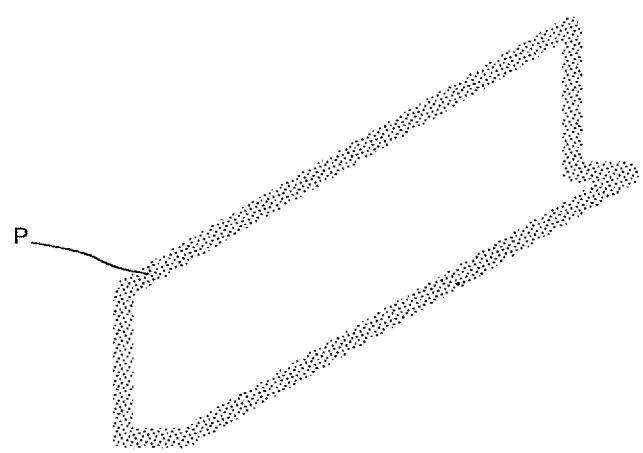
FIG. 3 is a perspective view illustrating a plasma generating region according to Embodiment 1.
Figure 4:
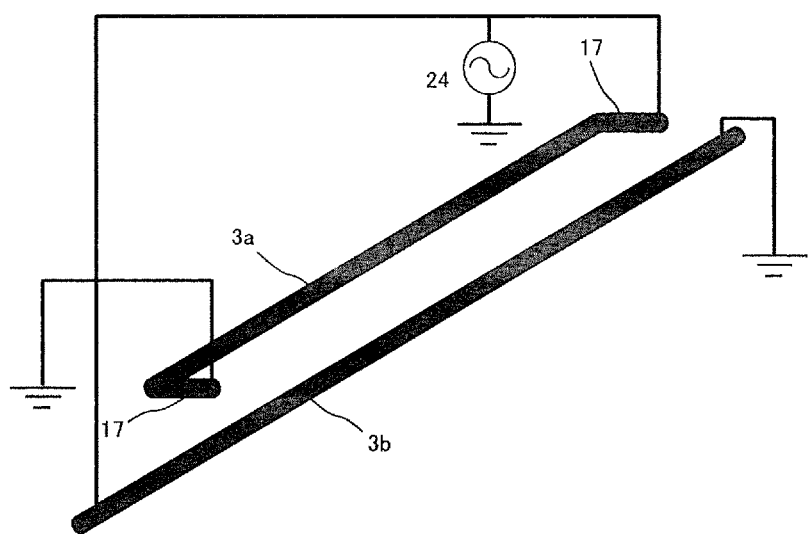
FIG. 4 is a perspective view illustrating a configuration of a coil according to Embodiment 1.

FIG. 1A illustrates a configuration of a plasma processing apparatus according to Embodiment 1, and is a sectional view in which inductively-coupled plasma torch unit T is cut along a plane which is perpendicular to a linear direction formed by opening portion 8 and which passes through dotted line A-A' in FIGS. 1B to 1E and 2. FIGS. 1B to 1E are sectional views in which inductively-coupled plasma torch unit T is cat along a plane which is parallel to the linear direction formed by opening portion 8 and which passes through dotted lines in FIG. 1A. FIG. 1B is a sectional view taken along dotted line B-B' in FIG. 1A, FIG. 1C is a sectional view taken along dotted line C-C' in FIG. 1A, FIG. 1D is a sectional view taken along dotted line D-D' in FIG. 1A, and FIG. 1E is a sectional view taken along dotted line E-E' in FIG. 1A. FIG. 2 is a plan view when inductively-coupled plasma torch unit T illustrated in FIGS. 1A to 1E is viewed upward from below in FIGS. 1A to 1E. FIG. 3 is a perspective view illustrating a plasma generating region, and is a view when inductively-coupled plasma torch unit T is viewed, in an obliquely downward direction from the front right side in FIG. 1A. FIG. 4 is a perspective view illustrating a configuration, of a coil. Similarly to FIG. 3, FIG. 4 is a view when inductively-coupled plasma torch unit T is viewed in the obliquely downward direction from the front right side in FIG. 1A.

Referring to FIGS. 1A to 1E, substrate 1 is arranged on tray 12 functioning as a substrate mounting table, and thin film 2 is arranged on substrate 1, In inductively-coupled, plasma torch unit T, coils 3a and 3b made of a conductor are arranged in the vicinity of elongated and annular chamber 7 which is defined by a space surrounded with first ceramic block 4, second ceramic block 5, and tray 12 (alternatively, substrate 1 thereon). More specifically, both coils 3 (3a and 3b) have a linear shape. Coil 3a located on a side far from tray 12 is arranged inside a groove disposed in second ceramic block 5, and coil 3b located on a side close to tray 12 is arranged inside ceramic pipe 13.

Substrate 1 is arranged on tray 12 functioning as the substrate mounting table. Coils 3 and chamber 7 are arranged along a plane which is substantiality perpendicular to a plane formed by tray 12.

Inductively-coupled plasma torch unit T is entirely surrounded with a shield member (not illustrated) made of a grounded conductor. In this manner, it is possible to effectively prevent high-frequency leakage (noise), and it is possible to effectively prevent undesirable abnormal discharge.

Chamber 7 is surrounded with an annular groove in which a groove disposed in first ceramic block 4 and second ceramic block 5 is continuously formed. That is, a configuration is adopted in which chamber 7 is entirely surrounded with a dielectric. Chamber 7 has an annular shape. The annular shape described herein means a continuously closed string shape. In the present embodiment, chamber 7 has the continuously closed string shape formed by connecting a linear portion forming a long side disposed in first ceramic block 4, linear portions forming two short sides arranged in both ends of the linear portion disposed in first ceramic block. 4, and a linear portion forming a long side disposed at the bottom of second ceramic block 5. In other words, chamber 7 includes two linear regions having a linear region (linear portion forming the long side disposed at the bottom of second ceramic block 5) adjacent to linear opening portion 8 and a linear region (linear portion forming the long side disposed in first ceramic block 4) arranged, parallel thereto. An inner wall surface of annular chamber 7 which, configures opening portion 8 is a portion, in which ceramic pipe 13 is exposed in a direction of opening portion 8, and has a linear shape.

Therefore, in a region in which plasma is emitted to substrate 1 (in the vicinity of opening portion 8), a distance is constant between substrate 1 or tray 12 and the inner wall surface of chamber 7. Accordingly, uniform processing can be performed thereon. Chamber 7 is flat, and opening portion 8 is opened by linearly cutting out a portion of a dielectric surrounding chamber 7.

Coil 3 includes two linear conductors arranged along only the two linear regions. That is, coil 3 is not disposed along the linear portion forming the two short sides. According to the inductively-coupled plasma torch in the related art, a helical coil is normally disposed so as to surround a cylindrical chamber. That is, the coil is arranged along the entire chamber. According to a new elongated type (in which linear plasma processing is achieved) of the inductively-coupled, plasma, torch disclosed, in. T. Okumura and H. Kawaura, Jpn. J. Appl. Phys. 52 (2013) 05EE01, the coil is also arranged along the entire chamber.

The present inventors have revealed for the first time that even the coil-shape as in the present embodiment can generate thermal plasma without any problem. According to the chamber including the two long sides and the two short sides in this way, desired plasma can be obtained by arranging the coil along only the long sides including the longer region. Therefore, it is possible to achieve a plasma processing apparatus which can be freely designed. According to the helical or spiral coil in the related art, the coil cannot be arranged inside a cylinder. However, as described in the present embodiment, since the coil has the linear shape, there is a significant advantage in that the coil can be arranged in a rotating cylinder.

As illustrated in FIG. 4, high-frequency power in the opposite direction (opposite phase) is applied to coils 3a and 3b along the longitudinal direction of opening portion 3. Here, a case has been described where one high-frequency power source is divided. However, two high-frequency power sources may be operated in synchronization with each other by properly using a phase shifter. Since coils 3a and 3b configure a parallel circuit, combined inductance is reduced, thereby leading to an advantage in that a low drive voltage is required. Copper bar 17 serving as a connection portion which is continuous with coil. 3a in the vertical direction is disposed in both ends of coil 3a. Coil 3a is electrically connected to the outside by penetrating refrigerant flow path 16 (details to be described later) and second ceramic block 5. On the other hand, coil 3b is electrically connected to the outside by penetrating ceramic pipe 13 and penetrating a rotary mechanism configured to include a rotary joint.

Plasma P generated in chamber 7 is ejected toward substrate 1 from a plasma ejection port (linear opening portion 8 forming the long side disposed at the bottom, of second ceramic block 5) which forms the bottom portion of chamber 7. The longitudinal direction of chamber 7 and the longitudinal direction of the opening portion 8 are arranged parallel to each other.

A rectangular groove disposed in first ceramic block 4 is gas manifold 9, and internally has porous ceramic material fitted therein. Gas supplied to gas manifold 9 from gas supply pipe 10 is introduced into chamber 7 via gas supply hole 11 serving as a gas inlet portion located between the groove disposed in first ceramic block 4 and a planar portion, of second ceramic block 5. According to this configuration, the gas can uniformly and easily flow in the longitudinal direction.

A flow rate of the gas introduced into gas supply pipe 10 is controlled by providing a flow rate control device such as a mass flow controller on an upstream side thereof. Gas manifold 9 is configured to internally include a porous ceramic material. In this manner, it is possible to achieve uniform gas flow, and it is possible to prevent abnormal discharge in the vicinity of gas manifold 9.

Gas supply hole 11 is configured so that multiple round holes are disposed in the longitudinal direction. However, slit-shaped elongated holes may be disposed in the longitudinal direction.

Cylindrical ceramic pipe 13 is disposed between first ceramic block 4 and second ceramic block 5, and an arrangement is made so that an upper surface of the bottom portion of chamber 7 is configured to include ceramic pipe 13. That is, a portion configuring a surface which opposes tray 12 within a dielectric member surrounding chamber 7 is configured to include a cylinder arranged parallel to the linear direction of opening portion 8. There is provided a rotary mechanism which rotates ceramic pipe 13 around an axis thereof. Furthermore, ceramic pipe 13 has a cavity formed therein, and includes a mechanism which causes a refrigerant to flow into the cavity formed therein.

As illustrated in FIG. 1E, ceramic pipe 13 is longer than the length of opening portion 8 in the linear direction. The rotary mechanism (not illustrated) is arranged at a position which is sufficiently away from chamber 7. It is desirable to dispose a very precise rotation guide for the rotary mechanism so that a shape of chamber 7 is not changed by the rotation of ceramic pipe 13. Rotational power of a motor is transmitted by a mechanism such as a belt drive. Ceramic pipe 13 can employ a rotary joint so as to be rotatable while causing the refrigerant to flow therein.

Linear coil 3b is disposed along an axis of a cylinder inside rotating cylindrical ceramic pipe 13. This arrangement causes coil 3b and opening portion 8 to communicate with each other, and can shorten a distance between coil 3b and a linear portion of chamber 7 adjacent thereto. That is, it is possible to arrange coil 3 and chamber 7 close to each other. This arrangement significantly contributes to improved efficiency in generating plasma. That is, fast and efficient plasma processing can be achieved.

Refrigerant flow path 16 surrounded with first ceramic block 4 and third ceramic block 14 is disposed so as to cool first ceramic block 4. Coil 3a is configured so that a copper bar having a circular shape in a cross section is arranged inside refrigerant flow path 16 surrounded with second ceramic block 5 and fourth ceramic block 15. Coil 3a may be configured to include a hollow pipe, and the refrigerant may be supplied and discharged via another system separated from refrigerant flow path 16.

In this way, coil 3 and each ceramic component can be cooled by causing the refrigerant such as water to flow in refrigerant flow path 16. First ceramic block 4 and second ceramic block 5 require excellent heat resistance. Accordingly, as a material for both of these, it is suitable to use ceramic mainly containing silicon nitride, or ceramic mainly containing silicon, aluminum, oxygen, and nitrogen. Third ceramic block 14 and fourth ceramic block 15 do not require the heat resistance so much. Accordingly, it is possible to use relatively inexpensive ceramic such as aluminum, oxide (alumina).

Copper bar 17 is fixed to fourth ceramic block 15 by a joint (not illustrated), and is configured so that the refrigerant does not leak out therefrom. Outer O-ring 19 and inner O-ring 20 are respectively arranged between first ceramic block 4 and third ceramic block 14, and between second ceramic block 5 and fourth ceramic block 15, and are configured so that the refrigerant does not leak out therefrom.

As illustrated in FIG. 1B, refrigerant flow path 16 is internally partitioned by partition 21, and forms a continuous flow path. A configuration is adopted in which the direction of high-frequency current flowing in coil 3 is parallel to the flowing direction of the refrigerant flowing in refrigerant flow path 16. As is understood from FIGS. 2 and 3, generated plasma P has a shape the same as that of an outer edge of a three-dimensional structure in which two rectangles having an equal length in the linear direction of opening portion 8 are joined to each other in an L-shape. In this way, plasma P has a slightly distorted shape compared to the example in the related art. The reason is that it is necessary to arrange chamber 7 so as not to interfere with ceramic pipe 13.

While plasma gas is supplied into chamber 7, the gas is ejected to substrate 1 through opening portion 8, and high-frequency power is supplied to coil 3 from high-frequency power source 24, thereby generating plasma P in chamber 7. Plasma processing can be performed for thin film 2 on substrate 1 by emitting plasma P to substrate 1 through opening portion 8. Substrate 1 is processed by relatively moving chamber 7 and tray 12 in the direction perpendicular to the linear direction (longitudinal direction) of opening portion 8. That is, inductively-coupled, plasma torch unit T or tray 12 is moved in rightward and leftward directions in FIGS. 1A to 1E.

When a distance between, inductively-coupled plasma torch unit T and substrate 1 is shortened in order to perform efficient processing on substrate 1, an inner wall surface of chamber 7 in the vicinity of tray 12, which is a portion opposite to tray 12 (portion opposing tray 12), receives the largest amount of heat. Accordingly, it is necessary to effectively cool the portion in order to suppress damage. Therefore, the present embodiment adopts a configuration of using ceramic pipe 13 which internally includes refrigerant flow path 16. Strength can be reliably reinforced, and internal pressure can be increased by forming ceramic pipe 13 in a cylindrical shape. Accordingly, much more cooling water can flow therethrough.

A configuration is adopted in which surfaces receiving heat from plasma P are always replaced with one another by rotating ceramic pipe 13. That is, a portion which becomes hot after receiving the heat from plasma P is rapidly cooled after the rotation of ceramic pipe 13 causes the portion to quickly move to a position where the portion does not receive the heat from plasma P. Therefore, compared to the example in the related art, it becomes possible to apply significantly greater high-frequency power, thereby enabling fast plasma processing.

Various types of plasma gas can be used as plasma gas to be supplied into chamber 7. However, in view of stability and ignitability of plasma, or durability of a member to be exposed to the plasma, it is desirable to use materials mainly containing inert gas and particularly noble gas. Among the materials, Ar gas is typically used. When the plasma is generated by using only Ar gas, the plasma becomes considerably hot (10,000 K or higher).

In the plasma processing apparatus as described above, while Ar gas or Ar+$H_2$ gas serving as the plasma gas is supplied into chamber 7, the gas is ejected to substrate 1 through opening portion 8, and high-frequency power of 13.56 MHz is supplied to coil 3 from a high-frequency power source. In this manner, a high-frequency electromagnetic field is generated in chamber 7, thereby generating plasma P. Plasma P is emitted through opening portion 8 so as to scan substrate 1. Accordingly, it is possible to perform thermal processing such as crystallization of a semiconductor film.

Proper conditions for generating plasma are set to approximately have values of distance between opening portion 8 and substrate 1=0.1 mm to 5 mm, scanning speed=20 mm/s to 3,000 mm/s, total flow rate of plasma gas=1 SLM to 100 SLM, $H_2$ concentration in Ar+$H_2$ gas=0% to 10%, and high-frequency power=0.5 kW to 30 kW. However, among these amounts, the flow rate of the gas and the power are indicated by a value per 100 mm in the length of opening portion 8. The reason is that it is considered proper to input an amount which is proportional to the length of opening portion 8, when determining parameters of the flow rate of the gas and the power.

As described above, according to the present embodiment, it is possible to input greater high-frequency power. That is, when high-temperature thermal processing is uniformly performed in the vicinity of a substrate surface within a very short time, or when low-temperature plasma processing for a substrate is performed by emitting plasma using reactive gas or by concurrently emitting the plasma with a reactive gas flow to the substrate, fast processing can be performed, and the plasma can be stably utilized. That is, since the apparatus can be operated using greater power, plasma emitting intensity can be increased. As a result, processing speed (the number of substrates which can be processed per unit time) becomes faster.

Embodiment 2

Hereinafter, Embodiment 2 will be described with reference to FIGS. 5A to 6.

Figure 5A:
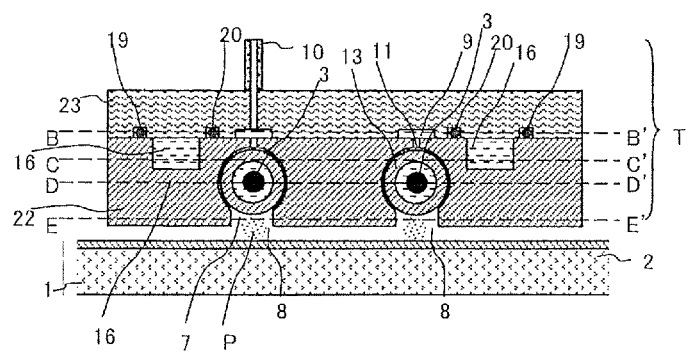
FIGS. 5A to 5E are sectional views illustrating a configuration of a plasma processing apparatus according to Embodiment 2.

FIG. 5A illustrates a configuration of a plasma processing apparatus according to Embodiment 2, and is a sectional view in which inductively-coupled plasma torch unit T is cut along a plane which is perpendicular to the linear direction formed by two opening portions 8 and which passes dotted line A-A' in FIGS. 5B to 5E.

Figure 5B:
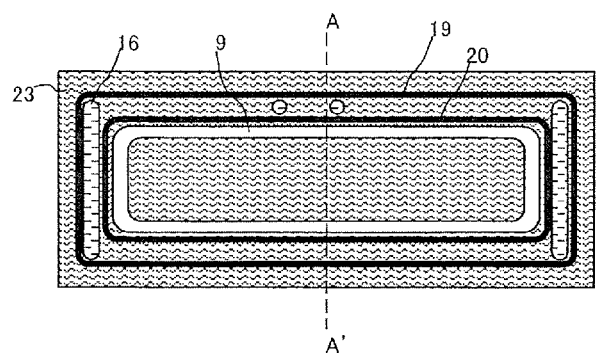
Figure 5C:
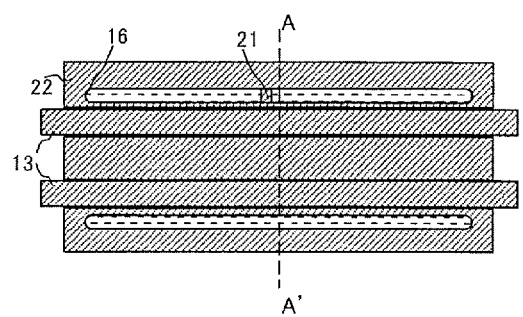
Figure 5D:
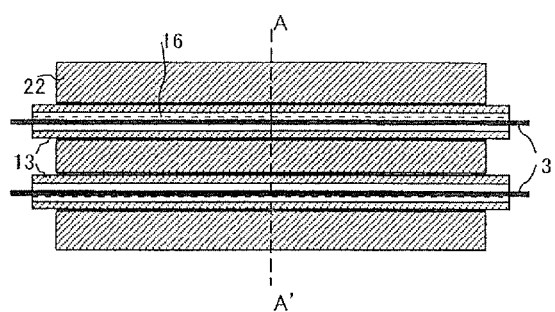
Figure 5E:
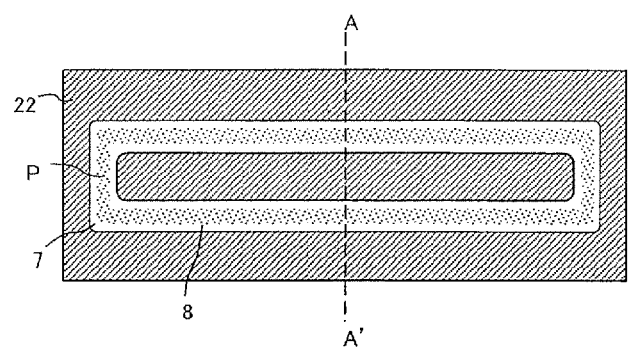
Figure 6:
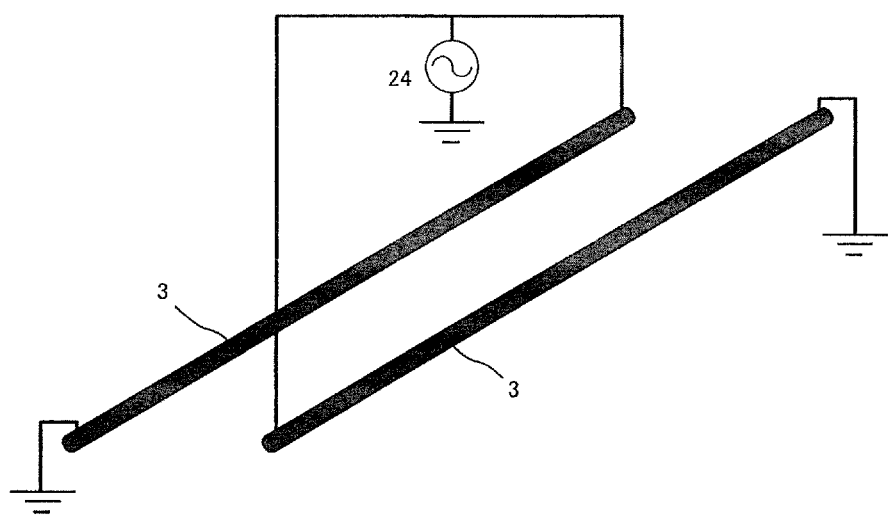
FIG. 6 is a perspective view illustrating a configuration of a coil according to Embodiment 2.

FIGS. 5B to 5E are sectional views in which inductively-coupled plasma torch unit T is cut along a plane which is parallel to the linear direction formed, by two opening portions 8 and which passes through dotted lines in FIG. 5A. FIG. 5B is a sectional view taken along dotted line B-B' in FIG. 5A, FIG. 5C is a sectional view taken along dotted line C-C' in FIG. 5A, FIG. 5D is a sectional view taken along dotted line D-D' in FIG. 5A, and FIG. 5E is a sectional view taken along dotted line E-E' in FIG. 5A. FIG. 6 is a perspective view illustrating a shape of coil 3, and is a view when coil 3 is viewed in the obliquely downward direction from the front right side in FIG. 5A.

Referring to FIGS. 5A to 5E, thin film 2 is arranged on substrate 1 mounted on tray 12 (not illustrated) serving as the substrate mounting table. In inductively-coupled plasma torch unit T, cell 3 including two linear conductors is arranged inside cylindrical ceramic pipe 13. Chamber 7 is defined by a space surrounded with ceramic pipe 13, first ceramic block 22, and substrate 1. Coil 3 and chamber 7 are arranged along a plane which is substantially parallel to a plane formed by tray 12.

Inductively-coupled plasma torch unit T is entirely surrounded with a shield member (not illustrated) made of a grounded conductor. In this manner, it is possible to effectively prevent high-frequency leakage (noise), and it is possible to effectively prevent undesirable abnormal discharge.

Chamber 7 is surrounded with an annular groove in which a groove disposed in first ceramic block 22 is continuously formed, and ceramic pipe 13. That is, a configuration is adopted in which chamber 7 is entirely surrounded with a dielectric. Chamber 7 has an annular shape. The annular shape described herein means a continuously closed string shape, and is not limited to a rectangular shape as illustrated in FIG. 5E.

In the present embodiment, chamber 7 having a racetrack, shape (continuously closed string shape formed by connecting straight lines which form two short sides to both ends of linear portions which form two long sides) is illustrated as an example. Plasma P generated in chamber 7 is ejected to substrate 1 through opening portion 8 (plasma ejection, port) in chamber 7. The longitudinal direction, of chamber 7 and the longitudinal direction of opening portion 8 serving as the plasma ejection port are arranged parallel to each other.

In other words, chamber 7 includes two linear regions (linear portion forming the long side disposed below first ceramic block 22) adjacent to two linear opening portions 8.

Coil 3 includes two linear conductors arranged along only the two linear regions. That is, similar to Embodiment 1, coil 3 is not disposed along the linear portion forming two short sides. In this chamber including the two long sides and the two short sides, desired plasma can be obtained by arranging the coil along only the long side which becomes the longer region.

Therefore, it is possible to achieve a plasma processing apparatus which can be freely designed. As illustrated in FIG. 6, high-frequency power in the opposite direction (opposite phase) is applied to two coils 3 along the longitudinal direction of opening portion 8. Coil 3 is electrically connected to the outside by penetrating ceramic pipe 13 and penetrating a rotary mechanism configured to include a rotary joint.

An annular groove disposed in second ceramic block 23 is gas manifold 9, and internally has porous ceramic material fitted therein. Gas supplied to gas manifold 9 from gas supply pipe 10 is introduced into chamber 7 via gas supply hole 11 (through-hole) serving as a gas inlet portion disposed, in first ceramic block 22 after passing through a gap between first ceramic block 22 and ceramic pipe 13.

According to this configuration, the gas can uniformly and easily flow in the longitudinal direction. A flow rate of the gas introduced into gas supply pipe 10 is controlled by providing a flow rate control device such as a mass flow controller on an upstream side thereof. Gas manifold 9 is configured to internally include the porous ceramic material. In this manner, it is possible to achieve uniform gas flow, and it is possible to prevent abnormal discharge in the vicinity of gas manifold 9.

Gas supply hole 11 is configured so that multiple round holes are disposed in the longitudinal direction. However, slit-shaped elongated holes may be disposed in the longitudinal direction.

Cylindrical ceramic pipe 13 is disposed in the groove disposed in first ceramic block 22, and an arrangement is made so that an upper surface of two long side portions configuring chamber 7 is configured to include ceramic pipe 13. That is, a portion configuring a surface which opposes tray 12 within the dielectric member surrounding the long side portion of chamber 7 is configured to include a cylinder arranged parallel to the linear direction of opening portion 8. There is provided a rotary mechanism which rotates ceramic pipe 13 around an axis thereof. Furthermore, ceramic pipe 13 has a cavity formed therein, and includes a mechanism which causes a refrigerant to flow into the cavity formed therein.

As illustrated in FIGS. 5C and 5D, ceramic pipe 13 is longer than the length of opening portion 8 in the linear direction. The rotary mechanism (not illustrated) is arranged at a position which is sufficiently away from chamber 7. It is desirable to dispose a very precise rotation guide for the rotary mechanism so that a shape of chamber 7 is not changed by the rotation of ceramic pipe 13. Rotational power of a motor is transmitted by a mechanism such as a belt drive. Ceramic pipe 13 can employ a rotary joint so as to be rotatable while causing the refrigerant to flow therein.

Two linear coils 3 are disposed along an axis of a cylinder inside rotating cylindrical ceramic pipe 13. This arrangement causes coil 3 and opening portion 8 to communicate with each other, and can shorten a distance between coil 3 and the linear portion of chamber 7 adjacent thereto. That is, it is possible to arrange coil 3 and chamber 7 close to each other. This arrangement significantly contributes to improved efficiency in generating plasma. That is, fast and efficient plasma processing can be achieved.

In this way, coil 3 and each ceramic component can be cooled by causing the refrigerant such as water to flow in refrigerant flow path 16. First ceramic block 22 requires excellent heat resistance. Accordingly, as a material for this, it is suitable to use ceramic mainly containing silicon nitride, or ceramic mainly containing silicon, aluminum, oxygen, and nitrogen. Second ceramic block 23 does not require the heat resistance so much. Accordingly, it is possible to use relatively inexpensive ceramic such as aluminum oxide (alumina). Outer O-ring 19 and inner O-ring 20 are respectively arranged between first ceramic block 22 and second ceramic block 23, and are configured so that the refrigerant does not leak out therefrom.

Refrigerant flow path 16 has a shape obtained by joining two long sides, two short sides arranged at a position farther away from substrate 1 than the long side, and a short vertical line connecting the long side and. the short side. In this way, refrigerant flow path 16 has a slightly distorted shape. The reason is that it is necessary to arrange refrigerant flow path 16 so as not to interfere with, ceramic pipe 13. As illustrated in FIG. 5C, refrigerant flow path 16 is internally partitioned by partition 21, and forms a continuous flow path.

While plasma gas is supplied, into chamber 7, the gas is ejected to substrate 1 through opening portion 8, and high-frequency power is supplied to coil 3 from high-frequency power source 24, thereby generating plasma P in. chamber 7. Plasma processing can be performed for thin film 2 on substrate 1 by emitting plasma P to substrate 1 through opening portion 8. Substrate 1 is processed by relatively moving chamber 7 and tray 12 in a direction perpendicular to the linear direction of opening portion 8. That is, inductively-coupled plasma torch unit T or tray 12 is moved in rightward and leftward directions in FIGS. 5A. to 5E.

When a distance between inductively-coupled plasma torch unit T and substrate 1 is shortened in order to perform, efficient processing on substrate 1, an inner wall surface of chamber 7 in the vicinity of tray 12, which is a portion opposite to tray 12 (portion opposing tray 12), receives the largest amount of heat. Accordingly, it is necessary to effectively cool the portion in order to suppress damage. Therefore, the present embodiment adopts a configuration of using ceramic pipe 13 which internally includes refrigerant flow path 16. Strength can be reliably reinforced, and. internal pressure can be increased by forming ceramic pipe 13 in a cylindrical shape. Accordingly, much more cooling water can flow therethrough.

A configuration is adopted in which surfaces receiving heat from plasma P are always replaced with one another by rotating ceramic pipe 13. That is, a portion which becomes hot after receiving the heat from plasma P is rapidly cooled, after the rotation of ceramic pipe 13 causes the portion to quickly move to a position where the portion does not receive the heat from plasma P. Therefore, as compared to the example in the related art, it becomes possible to apply significantly greater high-frequency power, thereby enabling fast plasma processing.

Various types of plasma gas can be used as plasma gas to be supplied into chamber 7. However, in view of stability and ignitability of plasma, or durability of a member to be exposed to the plasma, it is desirable to use materials mainly containing inert gas and particularly noble gas. Among the materials, Ar gas is typically used. When the plasma is generated by using only Ar gas, the plasma becomes considerably hot (10,000 K or higher).

According to this configuration, the length in the linear direction of opening portion 8 is equal to or greater than the width of substrate 1. Therefore, entire thin film 2 in the vicinity of the surface of substrate 1 can be processed by performing one scanning (relatively moving inductively-coupled plasma torch unit T and the substrate mounting table). According to this configuration, plasma on the short side of opening portion 8 which forms a rectangular shape as a whole is not emitted to a substrate, thereby enabling uniform processing.

In the plasma processing apparatus as described above, while Ar gas or Ar+$H_2$ gas serving as the plasma gas is supplied into chamber 7, the gas is ejected to substrate 1 through opening portion 8, and high-frequency power of 13.56 MHz is supplied to coil 3 from a high-frequency power source (not illustrated). In this manner, a high-frequency electromagnetic field is generated in chamber 7, thereby generating plasma P. Plasma P is emitted to substrate 1 through opening portion 8. Accordingly, it is possible to perform thermal processing such as crystallization of a semiconductor film.

Proper conditions for generating plasma are set to approximately have values of distance between opening portion 8 and substrate 1=0.1 mm to 5 mm, scanning speed=20 mm/s to 3,000 mm/s, total flow rate of plasma gas=1 SLM to 100 SLM, $H_2$ concentration in Ar+$H_2$ gas=0% to 10%, and high-frequency power=0.5 kW to 30 kW. However, among these amounts, the flow rate of the gas and the power are indicated by a value per 100 mm in the length of opening portion 8. The reason is that it is considered proper to input an amount which is proportional to the length of opening portion 8, when determining parameters of the flow rate of the gas and the power.

As described above, according to the present embodiment, a configuration is adopted in which substrate 1 is close to elongated thermal plasma, and in which plasma is directly emitted to substrate 1 by using both sides of two long linear portions configuring elongated chamber 7, thereby providing excellent efficiency in utilizing gas and high-frequency power. That is, the plasma is emitted to substrate 1 twice by performing one scanning. Accordingly, plasma processing can be more quickly performed. When high-temperature thermal processing is uniformly performed in the vicinity of the substrate surface within a very short time, or when low-temperature plasma processing for the substrate is performed by emitting plasma using reactive gas or by concurrently emitting the plasma with a reactive gas flow to the substrate, fast processing can be performed, and the plasma can be stably utilized.

Embodiment 3

Hereinafter, Embodiment 3 will foe described with reference to FIGS. 7A and 7B.

Figure 7A:
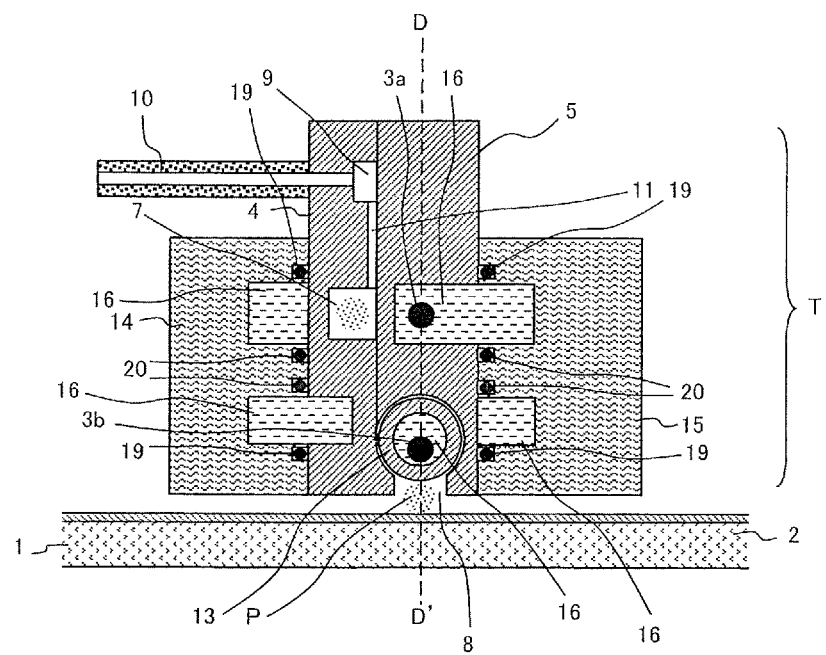
FIGS. 7A and 7B are sectional views illustrating a configuration of a plasma processing apparatus according to Embodiment 3.
Figure 7B:
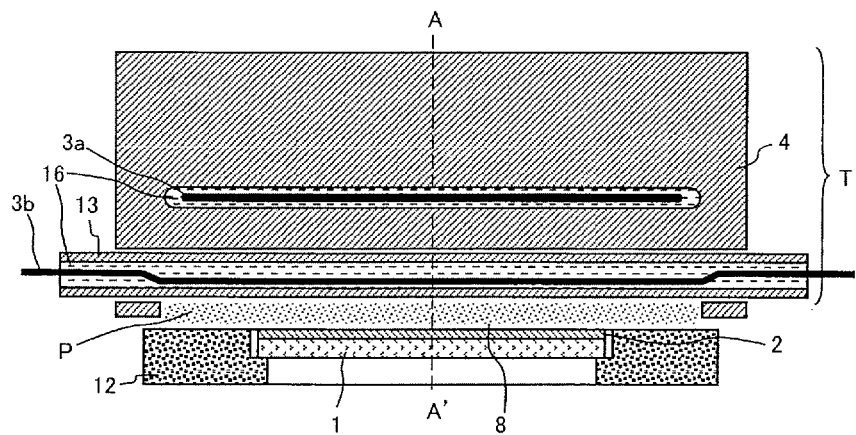

FIG. 7A illustrates a configuration of a plasma processing apparatus according to Embodiment 3, is a sectional view in which inductively-coupled plasma torch unit T is cut along a plane which is perpendicular to. the linear direction formed by opening portion 8 and which passes through, dotted line A-A' in FIG. 7B, and corresponds to FIG. 1A. FIG. 7B is a sectional view in which inductively-coupled plasma torch unit T is cut along a plane which is parallel to the linear direction formed by two opening portions 8 and which passes through dotted line D-D' in FIG. 7A, and corresponds to FIG. 1D.

A shape of coil 3b is different from that according to Embodiment 1. Referring to FIGS. 7A and 7B, coil 3b has a shape which is intermediately bent so that a portion extending along opening portion 8 is close to opening portion 3 and other portions are arranged on the rotation axis (center) of ceramic pipe 13. In contrast, according to Embodiment 1, coil 3b is configured to be arranged on the rotation axis (center) of ceramic pipe 13 from, end to end.

In the configuration according to Embodiment 1, coil 3b may be rotated in response to the rotation of ceramic pipe 13, or may maintain a stationary state without being rotated. However, if coil 3b is close to opening portion 8 as in the present embodiment, plasma can be more efficiently generated. For this purpose, it is preferable to maintain the stationary state without rotating coil 3b in response to the rotation of ceramic pipe 13, while maintaining a state where coil 3b is arranged close to opening portion 8.

In order to achieve this configuration, in a rotary joint, it is necessary to draw both ends of coil 3b outward through a joint portion arranged coaxially with a rotation axis thereof. Therefore, coil 3b has a shape which is intermediately bent so that both end portions are arranged on the rotation axis (center) of ceramic pipe 13.

Embodiment 4

Hereinafter, Embodiment 4 will be described with reference to FIG. 8.

Figure 8:
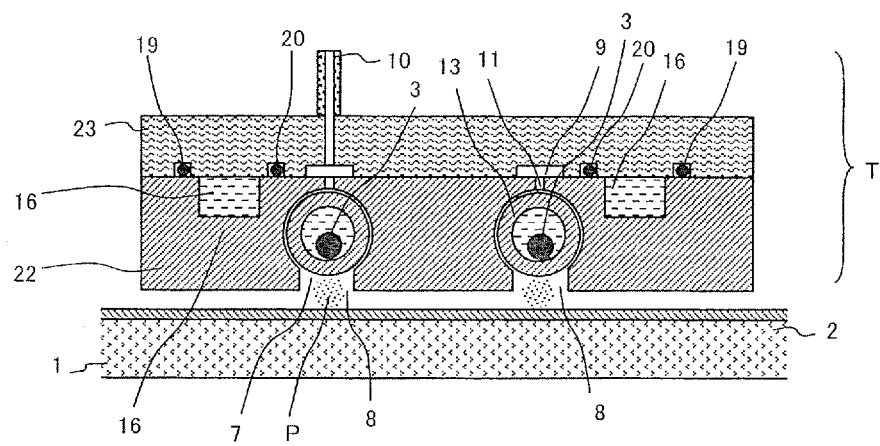
FIG. 8 is a sectional view illustrating a configuration of a plasma processing apparatus according to Embodiment 4.

FIG. 8 illustrates a configuration of a plasma processing apparatus according to Embodiment 4, is a sectional view in which inductively-coupled plasma torch unit T is cut along a plane which is perpendicular to the linear direction formed by two opening portions 8, and corresponds to FIG. 5A.

A shape of coil 3 is different from that according to Embodiment 2. Referring to FIG. 8, coil 3 has a shape which is intermediately bent so that a portion, extending along opening portion 8 is close to opening portion 8 and other portions are arranged on the rotation axis (center) of ceramic pipe 13. The shape is the same as that of coil 3b in FIG. 7B.

In contrast, according to Embodiment 2, coil 3 is configured to be arranged on the rotation axis (center) of ceramic pipe 13 from end to end. In the configuration. according to Embodiment 2, coil 3 may be rotated in response to the rotation of ceramic pipe 13, or may maintain a stationary state without being rotated. However, if coil 3 is close to opening portion 8 as in the present embodiment, plasma can be more efficiently generated. For this purpose, it is preferable to maintain the stationary state without rotating coil 3 in response to the rotation of ceramic pipe 13, while maintaining a state where coil 3 is arranged close to opening portion 8. In order to achieve this configuration, in a rotary joint, it is necessary to draw both ends of coil 3 outward through a joint portion arranged coaxially with a rotation axis thereof. Therefore, coil 3 has a shape which is intermediately bent so that both end portions are arranged on the rotation axis (center) of ceramic pipe 13.

Embodiment 5

Hereinafter, Embodiment 5 will be described with reference to FIG. 9.

Figure 9:
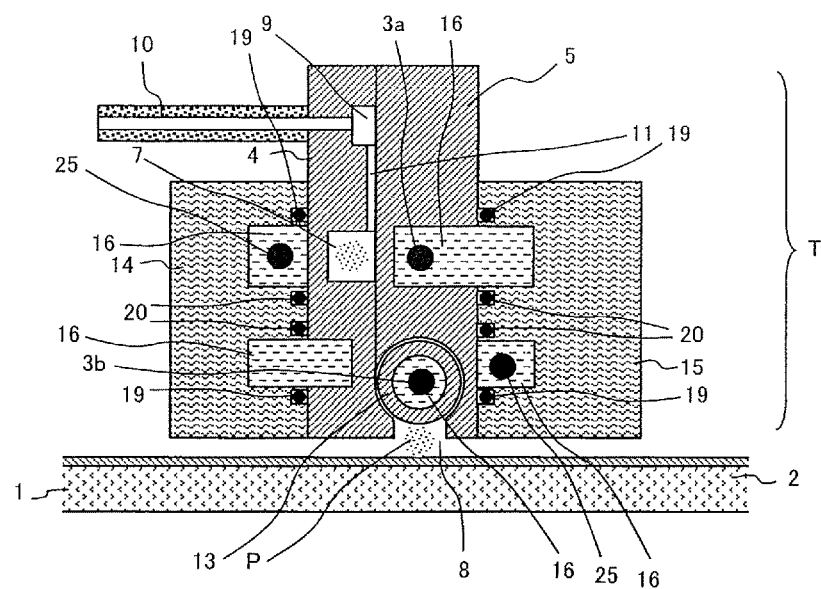
FIG. 9 is a sectional view illustrating a configuration of a plasma processing apparatus according to Embodiment 5.

FIG. 9 illustrates a configuration of a plasma processing apparatus according to Embodiment 5, is a sectional view in which inductively-coupled plasma torch unit T is cut along a plane which is perpendicular to the linear direction formed by opening portion 8, and corresponds to FIG. 1A.

Embodiment 5 is different from Embodiment 1 In that conducting bar 25 is arranged inside refrigerant flow path 16 including a groove disposed in third ceramic block 14 and fourth ceramic block 15. Conducting bar 25 is grounded, or is brought into an electrically floating state. According to this configuration, a strong electric field is generated between coil 3 and conducting bar 25. Accordingly, compared to Embodiment 1, an electric field Inside chamber 7 becomes stronger, thereby leading to an advantage in that a plasma ignitability is improved (discharge starts with low power).

Embodiment 6

Hereinafter, Embodiment 6 will be described with reference to FIGS. 10A and 10B.

Figure 10A:
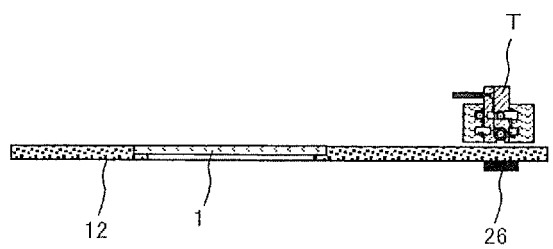
FIGS. 10A and 10B are sectional views illustrating a configuration of a plasma, processing apparatus according to Embodiment 6.
Figure 10B:
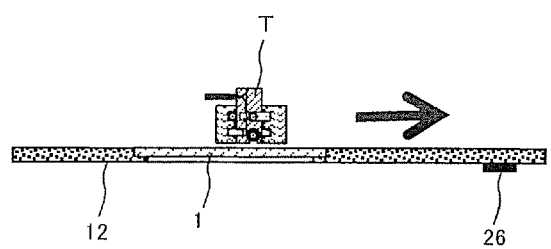

FIGS. 10A and 10B illustrate a configuration of a plasma processing apparatus according to Embodiment 6, and are sectional views in which a region including entire fray 12 is cut along a plane which is perpendicular to the linear direction formed by opening portion 8 of inductively-coupled plasma torch unit T.

Embodiment 6 is different from Embodiment 1 in that conducting bar 25 is arranged inside refrigerant flow path 16 including a groove disposed in third ceramic block 14 and conducting plate 26 is arranged in a portion away from a position for mounting substrate 1 on tray 12. According to Embodiment 5, two conducting bars 25 are arranged at a position close to both coil 3a located, on a side far from tray 12 and coil 3b located on a side close to tray 12. However, according to the present embodiment, conducting bar 25 is arranged at only a position close to coil 3a located on the side far from tray 12.

Since ignitability is insufficiently improved according to the embodiments described so far, conducting plate 26 is disposed on a side opposite to inductively-coupled plasma torch unit T in tray 12. In a state where conducting plate 26 is arranged close to inductively-coupled plasma torch unit T, an arrangement is made so that tray 12 is located between inductively-coupled plasma torch unit T and conducting plate 26 as illustrated in FIG. 10A. Accordingly, it is possible to obtain satisfactory ignitability by using a strong electric field generated between, coil 3b and conducting plate 26. The strong electric field is not needed when maintaining discharge after plasma is generated once. Therefore, substrate 1 can be processed by moving tray 12 in a direction of an arrow while maintaining the discharge as illustrated in FIG. 10B. Conducting plate 26 is grounded, or is brought into an electrically floating state.

Embodiment 7

Hereinafter, Embodiment 7 will be described with reference to FIG. 11.

Figure 11:
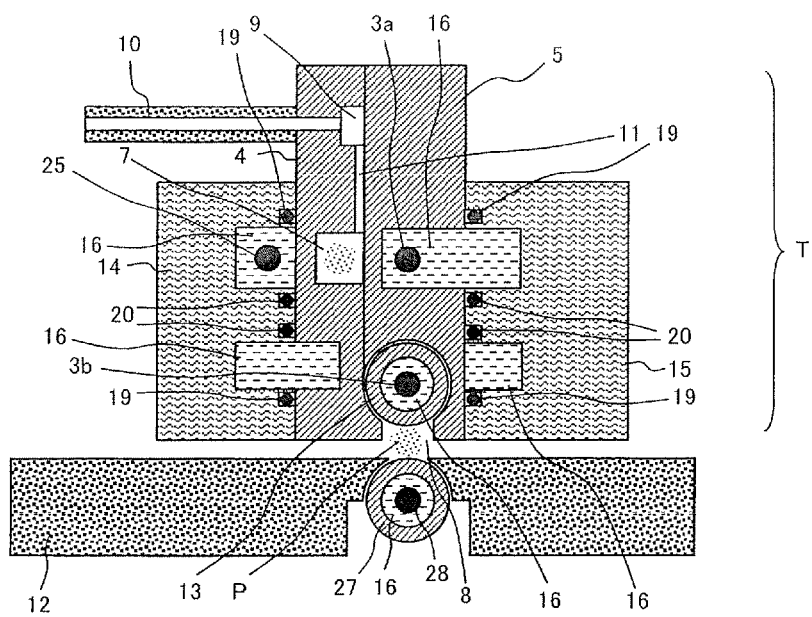
FIG. 11 is a sectional view illustrating a configuration of a plasma processing apparatus according to Embodiment 7.

FIG. 11 illustrates a configuration of a plasma processing apparatus according to Embodiment 7, is a sectional view in which inductively-coupled plasma torch unit T is cut along a plane which is perpendicular to the linear direction formed by opening portion 8, and corresponds to FIG. 1A. However, whereas FIGS. 1A to 1E illustrate a state where substrate 1 is located close to inductively-coupled plasma torch unit T, FIG. 11 illustrates a state where substrate 1 is located at a position away from inductively-coupled plasma torch unit T. More specifically, FIG. 11 illustrates an arrangement when plasma is ignited, and corresponds to FIG. 10A in that sense.

A configuration of inductively-coupled plasma torch unit T according to the present embodiment is the same as that according to Embodiment 6. A solution for obtaining satisfactory ignitability is different from that according to Embodiment 6. According to the present embodiment, conducting bar 25 is arranged inside refrigerant flow path 16 including a groove disposed in third ceramic block 14. Ceramic pipe 27 is arranged in a partial portion away from a position for mounting substrate 1 on tray 12. Ceramic pipe 27 is fitted into a cylindrical recess disposed in tray 12. A configuration is adopted in which a distance between ceramic pipe 27 and opening portion 8 when a side opposing inductively-coupled plasma torch unit T in ceramic pipe 27 is closest to opening portion 8 is substantially equal to a distance between tray 12 and opening portion 8 when the side is not closest to opening portion 8.

Ceramic pipe 27 includes a rotary mechanism which rotates ceramic pipe 27 around an axis thereof. Furthermore, ceramic pipe 27 internally includes a mechanism for causing the refrigerant to flow into a cavity formed therein, thereby forming refrigerant flow path 16.

Ceramic pipe 27 is longer than the length of opening portion 8 in the linear direction. The rotary mechanism (not illustrated) is arranged at a position which is sufficiently away from opening portion 8. It is desirable to dispose a very precise rotation guide for the rotary mechanism so that a distance between ceramic pipe 27 and opening portion 8 is not changed by the rotation of ceramic pipe 27. Rotational power of a motor is transmitted by a mechanism such as a belt drive. Ceramic pipe 27 can employ a rotary joint so as to be rotatable while causing the refrigerant to flow therein.

Linear conducting: bar 28 extending along an axis of a cylinder is disposed inside rotating cylindrical ceramic pipe 27. According to this configuration, it is possible to generate a strong electric field between coil 3b and conducting bar 23. Accordingly, it is possible to obtain satisfactory ignitability.

In thermal processing using an inductively-coupled plasma torch unit, after plasma is ignited, mode jumping is performed from weak discharge to strong discharge (inductively-coupled discharge mode). Until high-frequency matching or gas flow adjustment is completed, there is a case where a user does not want to start moving tray 12. In this case, for the time being after the mode jumping, a large amount of heat is supplied to tray 12. However, according to the present embodiment, there is an advantage in that damage to tray 12 is effectively prevented, by rotating ceramic pipe 27. Conducting bar 28 is grounded, or is brought into an electrically floating state.

The above-described plasma processing apparatus and method merely show a typical example within the applicable scope of the present invention.

For example, inductively-coupled plasma torch unit T may scan tray 12 which is fixed, or tray 12 may scan inductively-coupled plasma torch unit T which is fixed.

As a typical example, a case has been described where the chamber includes two linear regions having a linear region adjacent to the linear opening portion and a linear region arranged parallel thereto, and where the coil includes two linear conductors arranged along only the two linear regions. However, in a case where the linear region adjacent to the linear opening portion is configured to include the rotating ceramic pipe, a portion of the coil is arranged inside the ceramic pipe. In this manner, even if other regions in the chamber are not linear (any curve), it is possible to very efficiently generate plasma while the linear coil is excellently utilized for free design.

According to the configuration in this case, the chamber includes a linear region adjacent to the linear opening portion. In the dielectric member surrounding the chamber, a portion configuring a surface facing the substrate mounting table includes a cylinder arranged parallel to the linear direction of the opening portion. There is provided a rotary mechanism that rotates the cylinder around an axis of the cylinder. A portion of the coil is arranged in the cavity inside the cylinder.

According to various embodiments, it becomes possible to perform high-temperature processing in the vicinity of the surface of substrate 1. As a matter of course, these configurations are applicable to crystallization of TFT semiconductor films or reforming solar cell semiconductor films which are disclosed in the related art. These configurations can also be applied to various types of surface processing such as oxidation and activation of silicon semiconductor integrated circuits, annealing for forming silicide, cleaning and reduced degassing of a protection layer in plasma display panels, surface planarization and reduced degassing of a dielectric layer containing aggregated silica particulates, reflow of various electronic devices, and plasma doping using a solid impurity source.

As a method for manufacturing solar ceils, these configurations can also be applied to a method in which polycrystalline silicon films are obtained by coating a substrate upper surface with powder obtained by pulverizing a silicon ingot, and by emitting plasma to the powder so as to be melted.

In order to facilitate description, the term "thermal plasma" has been used. However, it is difficult to strictly distinguish between the thermal plasma and low-temperature plasma. For example, as explained in pages 479 to 483, No. 8, Vol. 82 (2006), Journal published by Institute of Plasma Science and Nuclear Research, "Non-Equilibrium in Thermal Plasma" written by Yasunori Tanaka, it is difficult to distinguish types of plasma only by using thermal equilibrium. One concern of the present disclosure is to perform thermal processing on a substrate. Without being bound by terms such as thermal plasma, thermal equilibrium plasma, and high-temperature plasma, the various embodiments are applicable to a technique for emitting high-temperature plasma to the substrate.

As described above, an inductively-coupled plasma torch may employ two modes for weak discharge and strong discharge. However, it is conceivable that the various embodiments are intended to effectively utilize the strong; discharge.

A case has been described in detail as an example where high-temperature thermal processing is uniformly performed in the vicinity of the substrate surface within a short time. However, the various embodiments are also applicable in a case where low-temperature plasma processing for the substrate is performed by emitting plasma using reactive gas or by concurrently emitting the plasma with a reactive gas flow. It is possible to realize etching or CVD by mixing the plasma gas with the reactive gas and by emitting the plasma using the reactive gas to the substrate.

Alternatively, while noble gas as the plasma gas or gas obtained by adding a small amount of $H_2$ gas to the noble gas is used, gas containing the reactive gas as shielding gas is supplied. In this manner, it is possible to realize plasma processing such as etching, CVD, and doping by concurrently emitting the plasma with a reactive gas flow. If gas which mainly contains argon as the plasma gas is used, thermal plasma is generated as described in detail in the embodiments.

In contrast, if gas which mainly contains helium as the plasma gas is used, plasma having a relatively low temperature can be generated. According to this method, it is possible to perform processing such as etching and film formation without heating a substrate too much. The reactive gas used in the etching includes halogen-containing gas, for example, $C_xF_y$ (x and y are natural numbers), $SF_6$, or the like. The reactive gas can be used in etching silicon or silicon compounds. If $O_2$ is used as the reactive gas, it is possible to remove organic materials or to perform resist ashing. The reactive gas used for CVD includes monosilane, disilane, or the like, and can be used in film formation of silicon or silicon compounds.

Alternatively, if mixed gas of $O_2$ and organic gas containing silicon represented by tetraethoxysilane (TEOS) is used, it is possible to form a silicon oxide film. In addition, it is possible to perform various types of low-temperature plasma processing such as surface processing for reforming water repellency and hydrophilic properties. As compared to the related art using capacity-coupled atmospheric pressure plasma, inductively-coupled plasma is employed. Accordingly, even when high power density per unit volume is input, arch discharge is less likely to occur, and plasma having higher density can be generated. As a result, fast reaction speed can be achieved, and thus it is possible to quickly and efficiently perform all processing for a desired processing target area of a substrate.

As described above, the various embodiments can be used in manufacturing various electronic devices, and is applicable to crystallization of TFT semiconductor films or reforming solar ceil semiconductor films. As a matter of course, the embodiments are applicable to various types of surface processing such as semiconductor activation annealing, cleaning and reduced degassing of a protection layer in plasma display panels, surface planarization and reduced degassing of a dielectric layer containing aggregated silica particulates, reflow of various electronic devices, and plasma doping using a solid impurity source. When high-temperature thermal processing is uniformly performed in the vicinity of the substrate surface within a very short time, fast processing can be performed, and the plasma cam be stably utilized. In this regard, the various embodiments are advantageously applicable.

In low-temperature plasma processing such as etching, film forming, doping, and surface reforming when various electronic devices are manufactured, it is possible to quickly and efficiently perform all processing for a desired processing target area of a substrate. In this regard, the various embodiment are also advantageously applicable.

What is claimed is:

1. A plasma processing apparatus which uses an inductively-coupled plasma torch, comprising:
    an annular chamber that includes a linear opening portion, and that communicates with the opening portion surrounded with a dielectric member except for the opening portion;
    a coil that is disposed in the vicinity of the chamber;
    a power source that is connected to the coil; and
    a substrate mounting table,
    wherein the chamber includes two linear regions having a linear region adjacent to the linear opening portion and a linear region arranged parallel thereto, and
    wherein the coil includes two linear conductors arranged along only the two linear regions,
    wherein in the dielectric member surrounding the chamber, a portion configuring a surface facing the substrate mounting table includes a cylinder arranged parallel to a linear direction of the opening portion,
    wherein a rotary mechanism rotates the cylinder around an axis of the cylinder.

2. The plasma processing apparatus of claim 1, wherein the cylinder is a pipe internally having a cavity, and includes a mechanism for causing a refrigerant to flow into the cavity formed inside the cylinder.

3. The plasma processing apparatus of claim 1, wherein the cylinder is longer than the length of the opening portion in the linear direction.

4. The plasma processing apparatus of claim 1, wherein the chamber is arranged along a plane which is substantially perpendicular to a plane formed by the substrate mounting table.

5. The plasma processing apparatus of claim 1, wherein the chamber is arranged along a plane which is substantially parallel to a plane formed by the substrate mounting table.

6. The plasma processing apparatus of claim 1, wherein one of the coils is arranged in the cavity inside the cylinder.

* * * * *